United States Patent
Kim et al.

(10) Patent No.: US 9,560,696 B2
(45) Date of Patent: Jan. 31, 2017

(54) THERMAL TREATMENT DEVICE FOR DISPLAY APPARATUS AND THERMAL TREATMENT METHOD USING THE SAME

(71) Applicant: Samsung Display Co., Ltd., Yongin, Gyeonggi-do (KR)

(72) Inventors: Jae-Sik Kim, Yongin (KR); Hyun-Sung Bang, Yongin (KR); Sung-Soon Im, Yongin (KR); Ji-Young Choung, Yongin (KR); Kyu-Hwan Hwang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 2 days.

(21) Appl. No.: 14/534,432

(22) Filed: Nov. 6, 2014

(65) Prior Publication Data

US 2015/0372259 A1    Dec. 24, 2015

(30) Foreign Application Priority Data

Jun. 19, 2014 (KR) .................. 10-2014-0075051

(51) Int. Cl.
  H05B 3/00    (2006.01)
  H01L 27/12    (2006.01)
  H01L 51/00    (2006.01)

(52) U.S. Cl.
  CPC ......... H05B 3/0047 (2013.01); H01L 27/1262 (2013.01); H01L 51/0013 (2013.01)

(58) Field of Classification Search
  CPC . H05B 3/0047; H01L 51/0013; H01L 27/1262
  See application file for complete search history.

(56) References Cited

U.S. PATENT DOCUMENTS

| | | | |
|---|---|---|---|
| 8,087,964 B2 * | 1/2012 | Yang | H01L 27/3213 445/24 |
| 8,093,612 B2 | 1/2012 | Tanaka | |
| 8,309,462 B1 * | 11/2012 | Yoshida | H01L 21/0337 438/667 |
| 2003/0064323 A1 * | 4/2003 | Sato | G03F 7/0035 430/313 |
| 2003/0108727 A1 * | 6/2003 | Kosaka | B41M 3/12 428/207 |
| 2005/0211697 A1 | 9/2005 | Knutson et al. | |
| 2011/0175099 A1 * | 7/2011 | Im | H01L 21/02532 257/64 |
| 2011/0207030 A1 * | 8/2011 | Shirasaki | G03F 1/62 430/5 |

FOREIGN PATENT DOCUMENTS

| | | |
|---|---|---|
| JP | 2007-035984 | 2/2007 |
| JP | 2010-027873 | 2/2010 |
| JP | 2010-093068 | 4/2010 |
| JP | 2014-011436 | 1/2014 |

* cited by examiner

*Primary Examiner* — Michelle Mandala
(74) *Attorney, Agent, or Firm* — Knobbe Martens Olson & Bear LLP (57) ABSTRACT

A thermal treatment method for a display apparatus includes providing an acceptor substrate on a substrate stage, providing on the acceptor substrate a pattern mask including a transfer layer, irradiating a flash light beam onto the pattern mask from a plurality of flash lamps, and transferring the transfer layer to the acceptor substrate. The plurality of flash lamps are symmetrically provided with respect to the acceptor substrate and are configured to irradiate flash light beams.

10 Claims, 11 Drawing Sheets

THERMAL TREATMENT DEVICE FOR DISPLAY APPARATUS AND THERMAL TREATMENT METHOD USING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2014-0075051, filed on Jun. 19, 2014, in the Korean Intellectual Property Office, the disclosure of which is incorporated herein in its entirety by reference.

BACKGROUND

Field

One or more embodiments of the present invention relate to a thermal treatment device for a display apparatus and a thermal treatment method using the thermal treatment device.

Description of the Related Technology

Typically, display devices such as organic light-emitting display devices may be used for display devices for mobile devices such as smartphones, tablet personal computers, laptop computers, digital cameras, camcorders, or portable information terminals, or electronic/electric products such as ultra-thin televisions and the like.

Recently, slimmer display devices are under development. For example, flexible display devices that are easy to carry and are applicable to apparatuses having various shapes may be used as next generation display devices. Among the above devices, a flexible display device based on organic light-emitting display technology is highlighted as a prevailing display device.

In a display device, a light-emitting layer is patterned to create a full color scheme.

SUMMARY OF CERTAIN INVENTIVE ASPECTS

One or more embodiments of the present invention include a thermal treatment device for a display apparatus and a thermal treatment method using the thermal treatment device.

Additional aspects will be set forth in part in the description which follows and, in part, will be apparent from the description, or may be learned by practice of the presented embodiments.

According to one or more embodiments, a thermal treatment method for a display apparatus includes providing an acceptor substrate on a substrate stage, providing on the acceptor substrate a pattern mask including a transfer layer, irradiating a flash light beam onto the pattern mask from a plurality of flash lamps, and transferring the transfer layer to the acceptor substrate, in which the plurality of flash lamps are symmetrically provided with respect to the acceptor substrate and are configured to irradiate flash light beams.

The plurality of flash lamps may sequentially irradiate flash light beams.

The plurality of flash lamps may irradiate flash light beams at a sequential light irradiation time.

While one of the plurality of flash lamps irradiates a flash light beam, at least one other flash lamp of the plurality of flash lamps may perform charging.

The plurality of flash lamps may irradiate flash light beams across an entire area of the acceptor substrate.

The plurality of flash lamps may alternately irradiate flash light beams for each processing area of the acceptor substrate while a substrate moves in one direction.

The plurality of flash lamps may be symmetrically arranged with respect to a neighboring processing area of the acceptor substrate.

A reflector may be provided at a rear of each of the plurality of flash lamps.

The pattern mask may form on a mask substrate a light pattern portion having a light absorption portion that absorbs a flash light beam and a light reflection portion that reflects the flash light beam, and a transfer layer is formed on the light pattern portion.

The transfer layer may contact the acceptor substrate.

A thin film layer may be formed on the acceptor substrate as a portion of the transfer layer formed in an area corresponding to the light absorption portion is melted.

The acceptor substrate may include at least one thin film transistor formed on the substrate, and an organic light-emitting device electrically connected to the thin film transistor and including a first electrode, a second electrode, and an intermediate layer having an organic light-emitting layer formed between the first and second electrodes, and wherein the transfer layer may include a material forming the organic light-emitting layer.

According to one or more embodiments of the present invention, a thermal treatment device for a display apparatus includes a substrate stage supporting an acceptor substrate, wherein a pattern mask having a transfer layer is formed on the acceptor substrate, and a plurality of flash lamps provided above the substrate stage, in which the plurality of flash lamps are symmetrically provided with respect to the acceptor substrate.

The pattern mask may include a mask substrate, and a light pattern portion formed on the mask substrate and comprising a light absorption portion that absorbs a flash light beam and a light reflection portion that reflects the flash light beam, and wherein the transfer layer may be formed on the light pattern portion.

A reflector may be provided at a rear of each of the plurality of flash lamps.

The reflector may have a curvature.

A light pattern portion that reflects a flash light beam may be formed on one surface of the reflector.

A plurality of flash lamps may be arranged at each reflector, and the plurality of flash lamps may be arranged along the curvature of the reflector to be separated from one another.

The reflector may include reflective metal.

The reflector may include plastic coated with a reflective metal film.

BRIEF DESCRIPTION OF THE DRAWINGS

These and/or other aspects will become apparent and more readily appreciated from the following description of the embodiments, taken in conjunction with the accompanying drawings in which:

FIGS. 5A to 5D are cross-sectional views sequentially illustrating a thermal treatment method according to an embodiment;

FIGS. 6A to 6C illustrate a thermal treatment method according to another embodiment, in which

DETAILED DESCRIPTION OF CERTAIN INVENTIVE EMBODIMENTS

Reference will now be made in detail to embodiments, examples of which are illustrated in the accompanying drawings. In this regard, the described embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Embodiments are described in detail with reference to the accompanying drawings. However, embodiments are not limited thereto and it will be understood that various changes in form and details may be made therein without departing from the spirit and scope of the following claims. That is, descriptions on particular structures or functions may be presented merely for explaining certain embodiments.

Terms such as "first" and "second" are used herein merely to describe a variety of constituent elements, but the constituent elements are not limited by the terms. Such terms are used only for the purpose of distinguishing one constituent element from another constituent element.

Terms used in the present specification are used for explaining a specific embodiment, not for limiting the inventive concepts. Thus, an expression used in a singular form in the present specification also includes the expression in its plural form unless clearly specified otherwise in context. Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Figure 1:
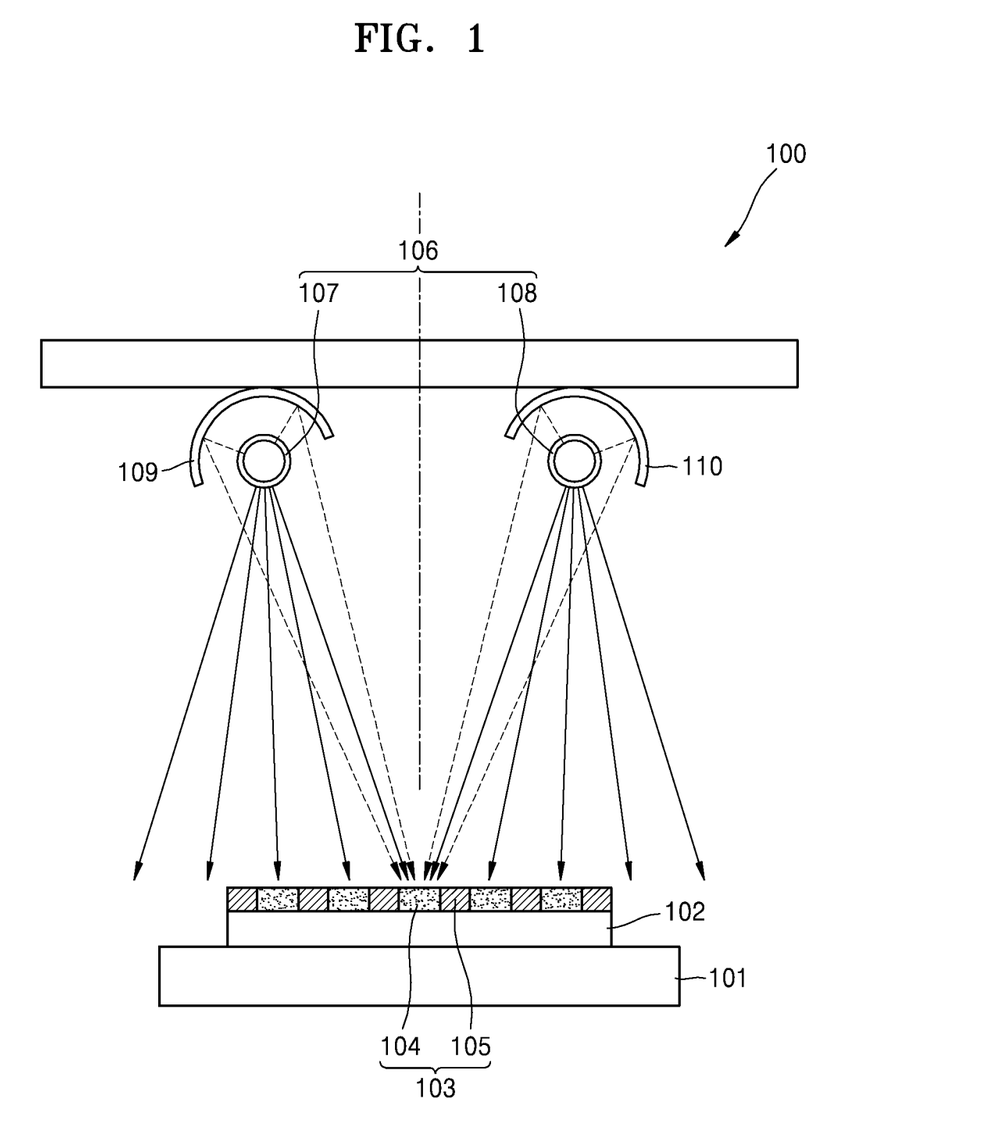
FIG. 1 illustrates a structure of a thermal treatment device for a display apparatus, according to an embodiment.

FIG. 1 illustrates a structure of a thermal treatment device 100 for a display apparatus, according to an embodiment.

Referring to FIG. 1, the thermal treatment device 100 may include a substrate stage 101 supporting an acceptor substrate 102, and a flash lamp 106 provided above the substrate stage 101. A pattern mask 103 may be provided on the acceptor substrate 102.

The substrate stage 101 is a substrate support plate on which the acceptor substrate 102 is provided. The substrate stage 101 may move in one direction.

The acceptor substrate 102 is provided on the substrate stage 101. The acceptor substrate 102 is a substrate on which a thin film layer to be patterned is formed.

The pattern mask 103 is provided on the acceptor substrate 102. The pattern mask 103 may have surface contact with the acceptor substrate 102. The pattern mask 103 includes a light absorption portion 104 absorbing a flash light beam irradiated from the flash lamp 106, and a light reflection portion 105 reflecting the flash light beam. The light absorption portion 104 may be formed in the same pattern as that of a thin film layer to be formed on the acceptor substrate 102.

The flash lamp 106 may be provided directly above the substrate stage 101. The flash lamp 106 may include a plurality of lamps. In one embodiment, the flash lamp 106 includes a first flash lamp 107 and a second flash lamp 108. The flash lamp 106 includes a discharge tube having an anode and a cathode provided at the opposite ends thereof, a trigger electrode, a coil, a switch, a capacitor, and a power apparatus which are provided on an outer circumferential surface of the discharge tube (not illustrated). A xenon (Xe) gas may be injected in the inside of the flash lamp 106.

The first flash lamp 107 and the second flash lamp 108 are symmetrically arranged with respect to the acceptor substrate 102. For example, the first flash lamp 107 and the second flash lamp 108 are provided at the same positions of the opposite side with respect to the acceptor substrate 102. Several flash lamps 106 may be provided without limitation as long as the flash lamps are symmetrically arranged with respect to the acceptor substrate 102.

A first reflector 109 is provided at the rear of the first flash lamp 107 and a second reflector 110 is provided at the rear of the second flash lamp 108. The first reflector 109 and the second reflector 110 reflect the flash light beam irradiated from the first flash lamp 107 and the second flash lamp 108 respectively toward the pattern mask 103.

The first reflector 109 and the second reflector 110 each have a predetermined curvature. In one embodiment, the first reflector 109 and the second reflector 110 may be formed semi-circularly to surround the first flash lamp 107 and the second flash lamp 108.

In some embodiments, a plurality of light pattern portions to efficiently reflect light may be formed on one surface of each of the first reflector 109 and the second reflector 110 respectively facing the first flash lamp 107 and the second flash lamp 108.

In some embodiments, a plurality of the first flash lamps 107 and a plurality of the second flash lamps 108 may be respectively arranged in the first reflector 109 and the second reflector 110. Each of the first flash lamps 107 and the second flash lamps 108 may be arranged to be separated at a predetermined interval along a curvature of each of the first reflector 109 and the second reflector 110.

The first reflector 109 and the second reflector 110 may include reflective metal. In some embodiments, the first reflector 109 and the second reflector 110 may include plastic and thus a reflective metal film having a high reflectance may be formed on a plastic surface.

Figure 2:
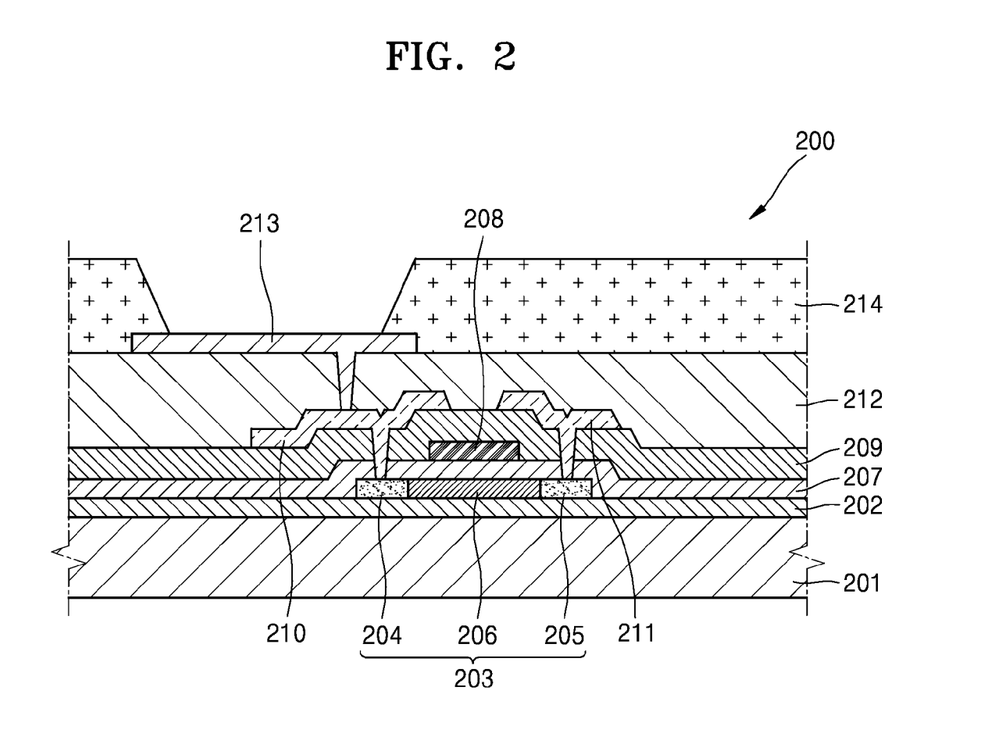
FIG. 2 is a cross-sectional view of an acceptor substrate according to an embodiment of the present invention.

FIG. 2 is a cross-sectional view of an acceptor substrate 200 according to an embodiment.

In one embodiment, a display device may be, for example, an organic light-emitting display device (OLED). However, the display device is not limited to a display device that produces an image by using a predetermined electric power applied thereto, for example, a liquid crystal display device (LCD), a field emission display device (FED), an electronic paper display device (EPD), or the like.

In some embodiments, the acceptor substrate 200 is a substrate for forming a thin film layer by irradiating a flash light beam. A plurality of thin film layers may be previously formed before the flash light beam is irradiated.

Referring to FIG. 2, a substrate 201 may include an insulation material having flexibility or an insulation material having rigidity. For example, the substrate 201 may be a film having flexibility, a glass substrate having rigidity, a polymer substrate, a metal substrate, or a combined substrate thereof. The substrate 201 may be transparent, semitransparent, or opaque.

A barrier layer 202 may be formed on the substrate 201. The barrier layer 202 may cover an entire upper surface of the substrate 201. The barrier layer 202 may include an inorganic layer or an organic layer.

For example, the barrier layer 202 may include one of inorganic substances such as for example silicon oxide (SiOx), silicon nitride (SiNx), silicon oxynitride (SiON), aluminum oxide (AlO), aluminum nitride (AlON), and the like, or organic substances such as for example acryl, polyimide, polyester, and the like. The barrier layer 202 may be provided in a single layer or a multilayer. The barrier layer 202 shields oxygen and moisture and planarizes an upper portion of the substrate 201.

A thin film transistor (TFT) may be formed on the barrier layer 202. In one embodiment, the TFT may be a top gate type TFT. However, the type of TFT is not limited thereto and a TFT of a different type, for example, a bottom gate type TFT may be used.

A semiconductor active layer 203 may be formed on the barrier layer 202. The semiconductor active layer 203 may include a source region 204 and a drain region 205 by doping N-type impurity ions or P-type impurity ions. An area between the source region 204 and the drain region 205 is a channel region 206 that is undoped.

The semiconductor active layer 203 may include an inorganic semiconductor such as for example amorphous silicon or poly silicon, or an organic semiconductor.

In some embodiments, the semiconductor active layer 203 may include an oxide semiconductor. For example, an oxide semiconductor may include 4, 12, 13, and 14 group metal elements such as zinc (Zn), indium (In), gallium (Ga), tin (Sn), cadmium (Cd), germanium (Ge), and hafnium (Hf), and a metal oxide selected from a combination of the above metal elements.

A gate insulation layer 207 may be provided on the semiconductor active layer 203. The gate insulation layer 207 includes an inorganic layer such as for example a silicon oxide or a silicon nitride. The gate insulation layer 207 may be provided in a single layer or a multilayer.

A gate electrode 208 is formed in a predetermined area on the gate insulation layer 207. The gate electrode 208 includes a single layer of Au, Ag, Cu, Ni, Pt, Pd, Al, Mo, Cr, or the like, a multiplayer thereof, or an alloy such as Al:Nd, Mo:W, or the like.

An interlayer insulation layer 209 is formed on the gate electrode 208 and may include an inorganic layer such as for example a silicon oxide or a silicon nitride. Alternatively, the interlayer insulation layer 209 may include an organic layer.

A source electrode 210 and a drain electrode 211 are formed on the interlayer insulation layer 209. A contact hole is formed by selectively removing the gate insulation layer 207 and the interlayer insulation layer 209. The source electrode 210 and the drain electrode 211 are electrically connected to the source region 204 and the drain region 205, respectively, via the contact hole.

A protection layer (passivation layer and/or planarization layer) 212 for preventing corrosion of the source electrode 210 and the drain electrode 211 from moisture and oxygen may be formed on the source electrode 210 and the drain electrode 211.

The protection layer 212 protects and planarizes a thin film layer provided thereunder. The protection layer 212 may be configured in a variety of shapes and may include an organic substance such as foe example benzocyclobutene (BCB) or acryl, or an inorganic substance such as for example SiNx. The protection layer 212 may be provided in a single layer or a multilayer.

An organic light-emitting device (OLED) may be formed on the TFT.

A first electrode 213 that is connected to the source electrode 210 or the drain electrode 211 via a contact hole is formed on the protection layer 212. The first electrode 213 functions as an anode and may include a variety of conductive materials. The first electrode 213 may be formed as a transparent electrode or a reflective electrode.

When the first electrode 213 is used as a transparent electrode, the first electrode 213 includes a transparent conductive layer such as for example ITO, IZO, ZnO, $In_2O_3$, or the like. When the first electrode 213 is used as a reflective electrode, a reflective layer includes Ag, Mg, Al, Pt, Pd, Au, Ni, Nd, Ir, Cr, or a compound thereof and then a transparent conductive layer including ITO, IZO, ZnO, $In_2O_3$, or the like, on the reflective layer.

A pixel defining layer 214 covers the protection layer 212 and a part of the first electrode 213. The pixel defining layer 214 defines a pixel area (PA) and a non-pixel area (NPA). The pixel defining layer 214 includes an organic substance or an inorganic substance. The pixel defining layer 214 may include an organic substance such as for example polyimide, polyamide, benzocyclobuthene, acryl resin, phenolic resin, or the like, or an inorganic substance such as for example SiNx. The pixel defining layer 214 may be provided in a single layer or a multilayer.

In one embodiment, an intermediate layer, for example, an organic light-emitting layer, may be formed by irradiating a flash light beam onto the first electrode 213.

Figure 3:
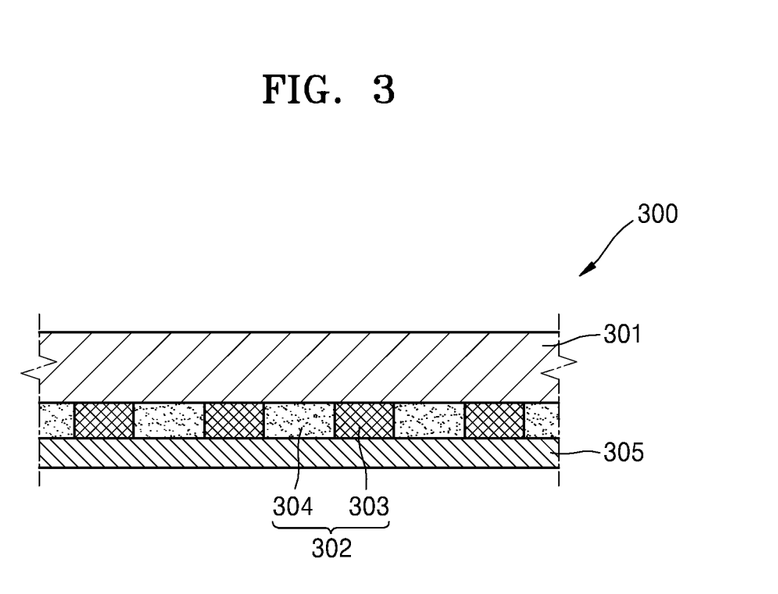
FIG. 3 is a cross-sectional view of a pattern mask having a transfer layer, according to an embodiment.

FIG. 3 is a cross-sectional view of a pattern mask 300 having a transfer layer, according to an embodiment. For convenience of explanation, the pattern mask 300 is illustrated to be arranged in the opposite direction.

Referring to FIG. 3, the pattern mask 300 may include a mask substrate 301 and an optical pattern portion 302 formed on the mask substrate 301.

The mask substrate 301 may be, for example, a glass substrate or a quartz substrate, including a transparent insulation material that transmits a flash light beam.

The optical pattern portion 302 that selectively absorbs or reflects a flash light beam irradiated from the flash lamp 106 of FIG. 1 is formed on the mask substrate 301. The optical pattern portion 302 includes a light absorbing portion 304 for absorbing the flash light beam and a light reflecting portion 303 for reflecting the flash light beam.

The light absorbing portion 304 may include a material having a low reflectance and a high melting point, such as for example, Mo, Cr, Ti, W, or an alloy thereof. The light reflecting portion 303 may include a material having a high reflectance, for example, Al, or an Al alloy. In one embodiment, the optical pattern portion 302 may include an insulation material such as for example silicon oxide on at least an area of the mask substrate 301.

The light absorbing portion 304 may be formed in substantially the same pattern as that of the intermediate layer having an organic light-emitting layer to be formed on the acceptor substrate 200 of FIG. 2.

A transfer layer 305 is formed on the optical pattern portion 302.

The transfer layer 305 includes a raw material of the intermediate layer to be formed on the acceptor substrate 200. In one embodiment, although the transfer layer 305 includes a material that is used to form the organic light-emitting layer provided in the intermediate layer, embodiments are not limited thereto. The transfer layer 305 may be deposited on the optical pattern portion 302 by using a nozzle (not shown). The transfer layer 305 may be deposited across the entire area of the pattern mask 300.

Figure 4:
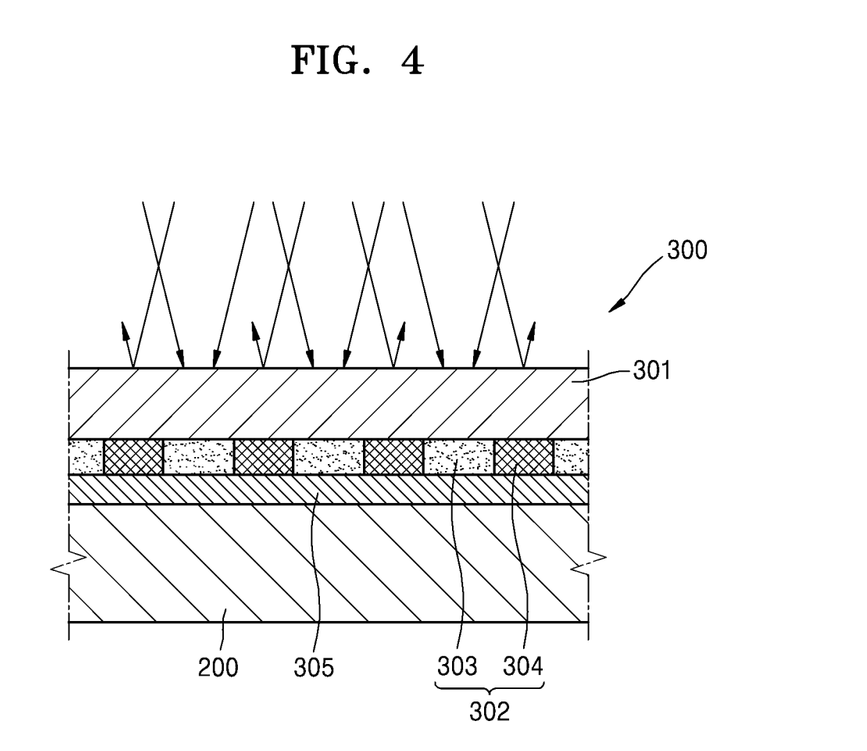
FIG. 4 is a cross-sectional view illustrating a state in which a flash light beam is irradiated onto a pattern mask of FIG. 3.

FIG. 4 is a cross-sectional view illustrating a state in which a flash light beam is irradiated onto the pattern mask 300 of FIG. 3.

Referring to FIG. 4, the pattern mask 300 is attached on the acceptor substrate 200. In the pattern mask 300, the optical pattern portion 302 is formed on the mask substrate 301, and the transfer layer 305 is deposited on the optical pattern portion 302. The transfer layer 305 may be attached on the acceptor substrate 200 by directly contacting a surface of the acceptor substrate 200.

The flash light beam irradiated from the flash lamp 106 of FIG. 1 passes through the mask substrate 301 that is transparent. The light absorbing portion 303 is heated by absorbing the flash light beam, and the light reflecting portion 304 reflects the flash light beam. When the light absorbing portion 303 is heated, a part of the transfer layer 305 formed in an area corresponding to the light absorbing portion 303 is melted and evaporated. The evaporated part of the transfer layer 305 is coated on a desired area of the acceptor substrate 200.

A thermal treatment method using the thermal treatment device 100 of FIG. 1 according to an embodiment is described below with reference to FIGS. 5A to 5D.

Figure 5A:
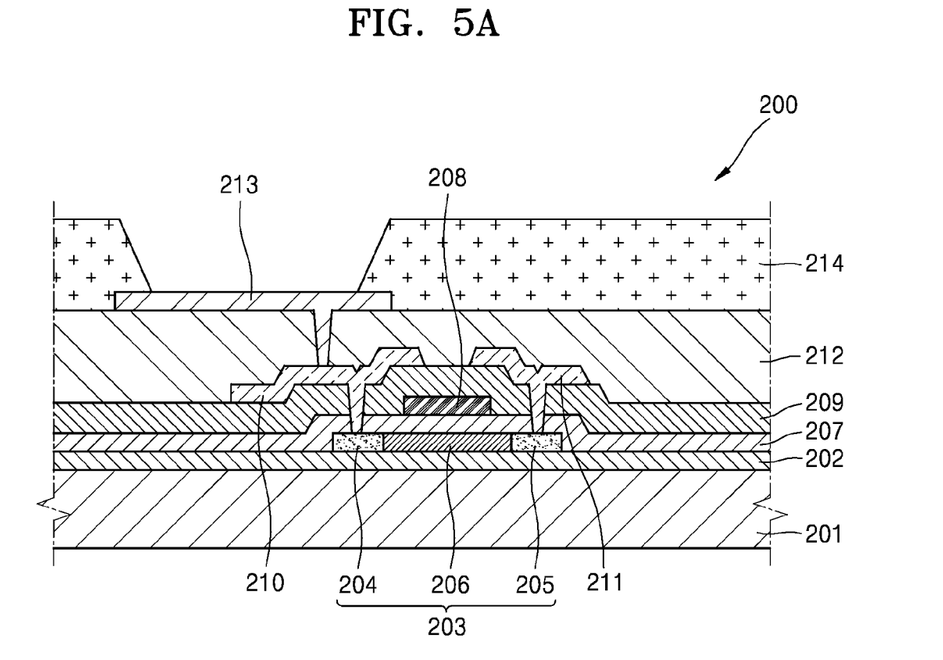
FIG. 5A is a cross-sectional view illustrating a state after an acceptor substrate of FIG. 2 is prepared.

Referring to FIG. 5A, the acceptor substrate 200 is prepared.

The TFT is formed on the substrate 201. The TFT includes the semiconductor active layer 203, the gate electrode 208, the source electrode 210, and the drain electrode 211. The first electrode 213 of the OLED is formed on the TFT. An edge of the first electrode 213 is covered by the pixel defining layer 214. At least an area of the first electrode 213 is exposed to the outside.

In one embodiment, the acceptor substrate 200 may be provided on the substrate stage 101. The substrate stage 101 may be moved in one direction.

Figure 5B:
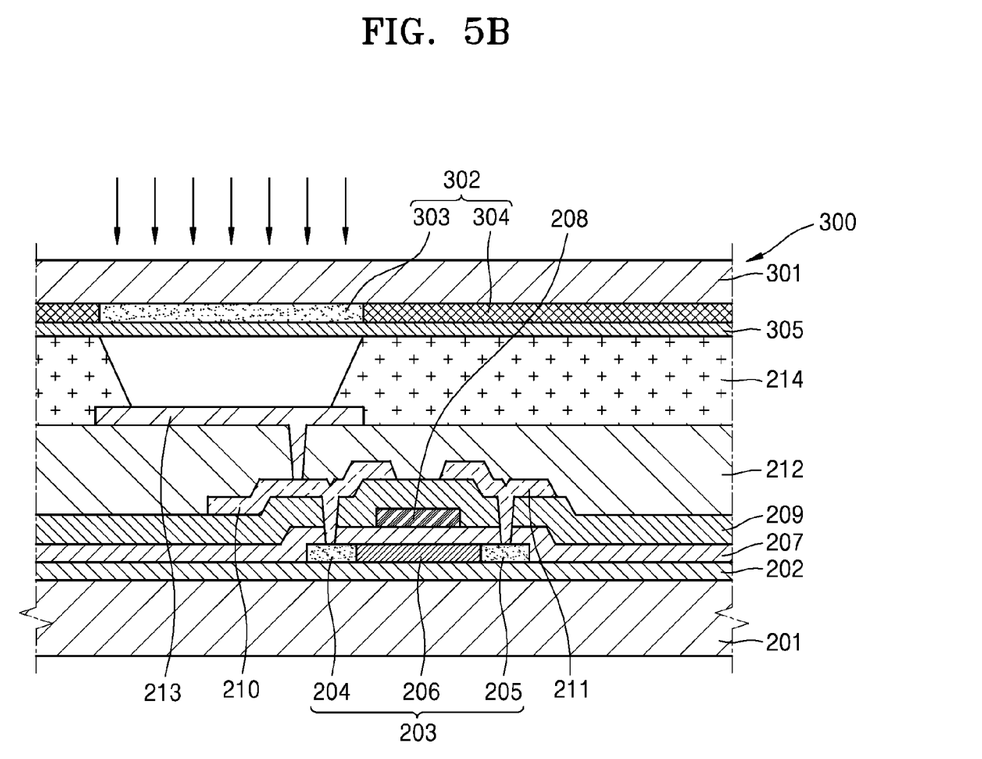
FIG. 5B is a cross-sectional view illustrating a state after a pattern mask is attached on an acceptor substrate of FIG. 5A.

Referring to FIG. 5B, the pattern mask 300 is attached on the acceptor substrate 200. The transfer layer 305 that is formed on the pattern mask 300 closely contacts the pixel defining layer 214 of the substrate 201. As the acceptor substrate 200 and the pattern mask 300 get a more uniform contact with each other, a transfer efficiency of the transfer layer 305 may be improved. Accordingly, a predetermined pressure may be applied to the pattern mask 300.

Next, a flash light beam is irradiated onto the pattern mask 300.

Flash light beams irradiated from the first flash lamp 107 and the second flash lamp 108 of FIG. 1 are irradiated onto the pattern mask 300. The flash light beams irradiated from the first flash lamp 107 and the second flash lamp 108 pass through the mask substrate 301 that is transparent and are selectively absorbed by the light absorbing portion 303. In one embodiment, the flash light beams irradiated from the first flash lamp 107 and the second flash lamp 108 may cover the entire area of the acceptor substrate 200.

In one embodiment, the first flash lamp 107 and the second flash lamp 108 are symmetrically arranged with respect to the acceptor substrate 200. The flash light beams irradiated from the first flash lamp 107 and the second flash lamp 108 may be irradiated onto the pattern mask 300 in a plurality of numbers. However, after first irradiation, the first flash lamp 107 and the second flash lamp 108 may require a long charging time for next irradiation.

In one embodiment, the first flash lamp 107 and the second flash lamp 108 irradiate flash light beams not simultaneously but sequentially onto the acceptor substrate 200.

While the flash light beam is irradiated from the first flash lamp 107 onto the acceptor substrate 200, the second flash lamp 108 does not irradiate a flash light and is in a standby state. During the standby state, the second flash lamp 108 accumulates electric charge needed for light radiation in a second capacitor (not shown) provided therein.

When an irradiation process of the first flash lamp 107 is completed, the second flash lamp 108 that completed charging irradiates a flash light beam onto the acceptor substrate 200. In doing so, the first flash lamp 107 is in a standby state. During the standby state, the first flash lamp 107 accumulates electric charge needed for next light radiation in a first capacitor (not shown) provided therein.

As such, while one flash lamp 107 irradiates a flash light beam, another flash lamp 108 is in a standby state and performs a charging process for the next light irradiation.

Also, the first flash lamp 107 and the second flash lamp 108 may irradiate the flash light beams at an alternating light irradiation time in a transfer area of the acceptor substrate 200, for example, an area where the intermediate layer having the organic light-emitting layer.

As such, when the light absorbing portion 303 is heated by the sequential light irradiation of the first flash lamp 107 and the second flash lamp 108, the part of the transfer layer 305 corresponding to the heated portion of the light absorbing portion 303 is melted and evaporated.

As described above, the first reflector 109 and the second reflector 110 are provided at the rear of the first flash lamp 107 and the second flash lamp 108 respectively. The first reflector 109 and the second reflector 100 are designed to allow energy applied to the acceptor substrate 200 to be uniformly supplied. When the flash light beams are irradiated from the first flash lamp 107 and the second flash lamp 108, the first reflector 109 and the second reflector 110 reflect the flash light beams toward the acceptor substrate 200.

Figure 5C:
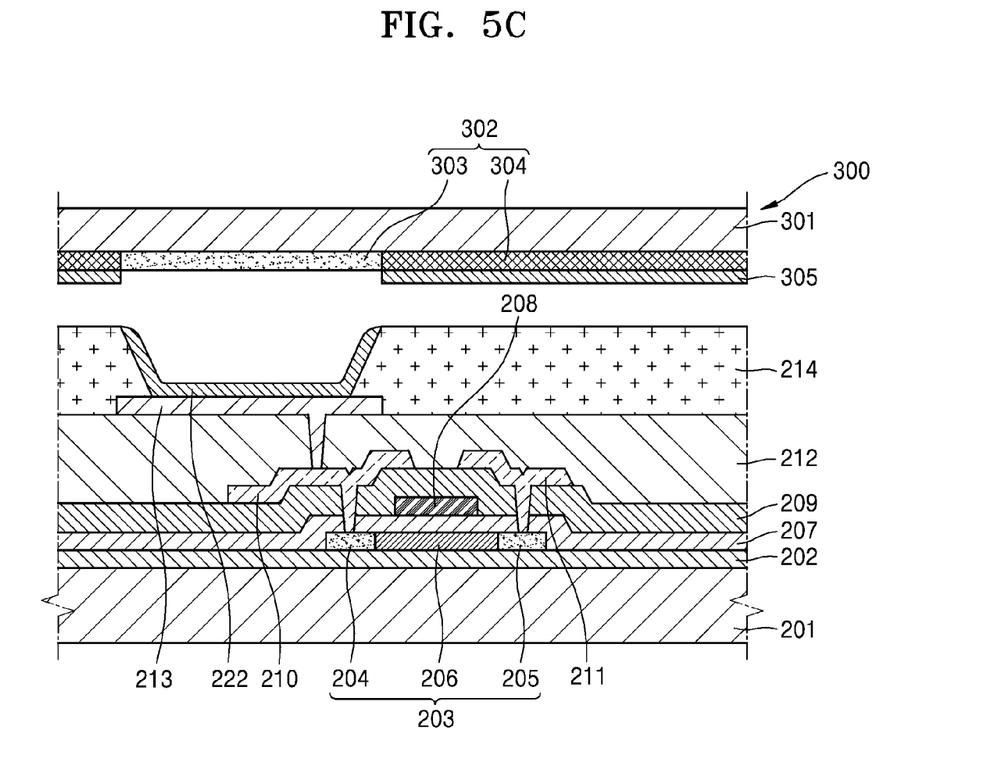
FIG. 5C is a cross-sectional view illustrating a state after a flash light beam is irradiated onto a pattern mask of FIG. 5B.

Referring to FIG. 5C, the evaporated part of the transfer layer 305 is transferred to the first electrode 213 that is exposed. When the transfer of an intermediate layer 222 having the organic light-emitting layer on the acceptor substrate 200 is completed, the pattern mask 300 is separated from the acceptor substrate 200.

The intermediate layer 222 may be formed in at least a part of the pixel defining layer 214 and the exposed area of the first electrode 213 on the acceptor substrate 200 that is separated from the pattern mask 300. In the pattern mask 300, a part of the transfer layer 305 in the area where the flash light beam is irradiated is transferred, whereas the other part of the transfer layer 305 remains on the pattern mask 300.

Figure 5D:
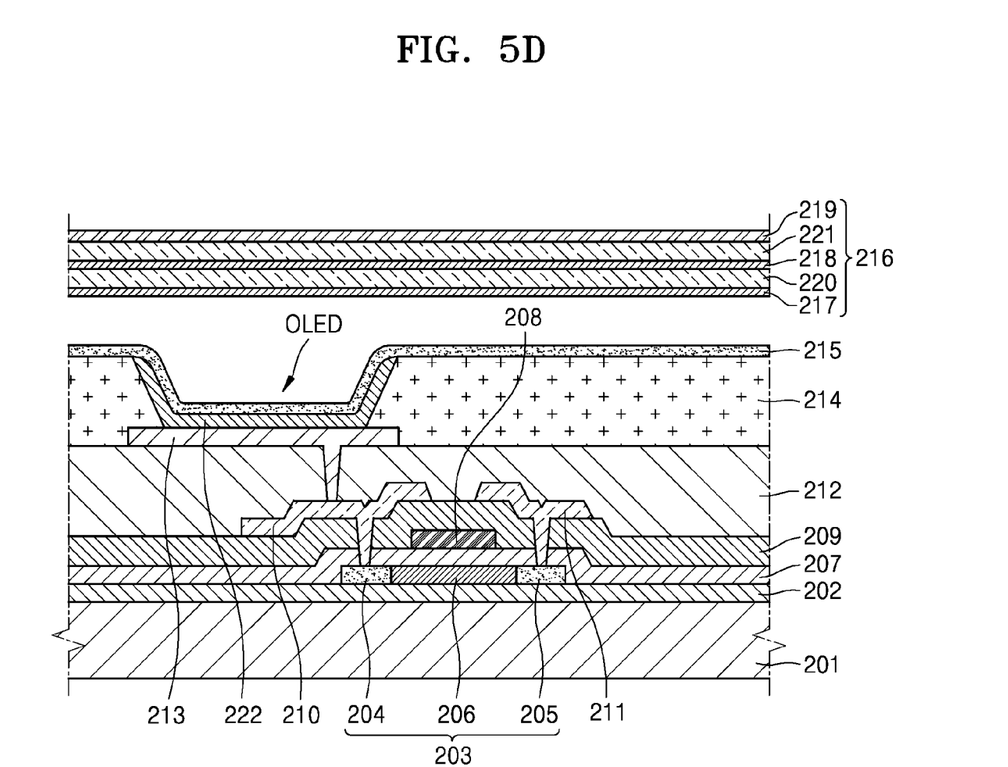
FIG. 5D is a cross-sectional view illustrating a state of combining a encapsulation portion on an acceptor substrate of FIG. 5C.

After the intermediate layer 222 is formed on the acceptor substrate 200, as illustrated in FIG. 5D, the second electrode 215 is formed on the intermediate layer 222 and an encapsulation portion 216 is provided above the second electrode 215.

In one embodiment, although the intermediate layer 222 includes the organic light-emitting layer as one example, in another example, the intermediate layer 222 includes an organic light-emitting layer and additionally includes at least one of a hole injection layer (HIL), a hole transport layer (HTL), an electron transport layer (ETL), and an electron injection layer (EIL). Embodiments are not limited thereto, and the intermediate layer 222 may include an organic light-emitting layer and further other various functional layers.

The second electrode 215 may function as a cathode of the organic light-emitting device. The second electrode 215 may be formed as a transparent electrode or a reflective electrode like the first electrode 213.

For example, when the second electrode 215 is used as a transparent electrode, metal having a small work function, such as for example, Li, Ca, LiF/Ca, LiF/Al, Al, Mg, and a compound thereof, is deposed on the intermediate layer 222, and then a transparent conductive layer including ITO, IZO, ZnO, $In_2O_3$, or the like may be further formed on the above metal and a compound thereof. When the second electrode 215 is used as a reflective electrode, the second electrode 215 may include Li, Ca, LiF/Ca, LiF/Al, Al, Mg, and a compound thereof.

The first electrode 213 may function as an anode and the second electrode 215 may function as a cathode, but embodiments are not limited thereto. For example, the first electrode 213 may function as a cathode and the second electrode 215 may function as an anode.

The encapsulation portion 216 may have a structure in which at least one layer of an organic layer or an inorganic layer is stacked.

For example, the encapsulation portion 216 may have a structure including at least one of inorganic layers 217, 218, and 219 such as for example silicon oxide ($SiO_2$), silicon nitride (SiNx), aluminum oxide ($Al_2O_3$), titanium oxide ($TiO_2$), zirconium oxide (ZrOx), zinc oxide (ZnO), or the like, and at least one of organic layers 220 and 221 such as for example epoxy, polyimide, polyethylene terephthalate, polycarbonate, polyethylene, polyacrylate, or the like.

The encapsulation portion 216 may have a structure in which the inorganic layers 217, 218, and 219 have a structure of at least two layers and the organic layers 220 and 221 have a structure of at least one layer. The inorganic layer 219 that is the top layer of the encapsulation portion 216 may be formed as an inorganic layer in order to prevent intrusion of moisture into the organic light-emitting device.

In a display device having the above structure, since flash light beams are sequentially irradiated from the first flash lamp 107 and the second flash lamp 108 that are symmetrically arranged with respect to the acceptor substrate 102, the charging time of the first flash lamp 107 and the second flash lamp 108 may be reduced by ½ at its maximum.

Results of analysis of pulse duration and energy density according to experiments performed by the present applicant are shown in Table 1.

TABLE 1

| Comparative Example | | Embodiment | |
|---|---|---|---|
| Pulse Duration | Energy Density (max) | Pulse Duration | Energy density (max) |
| 3.0 msec | 40 J/cm$^2$ | 1.5 msec | 40 J/cm$^2$ |
| 1.3 msec | 20 J/cm$^2$ | 0.75 msec | 20 J/cm$^2$ |
| 680 μsec | 9 J/cm$^2$ | 340 μsec | 9 J/cm$^2$ |
| 300 μsec | 5 J/cm$^2$ | 150 μsec | 5 J/cm$^2$ |

The comparative example is a case in which a plurality of flash lamps of the related art simultaneously irradiate flash light beams. The embodiment is a case in which the flash lamps 107 and 108 are symmetrically arranged and sequentially irradiate flash light beams as illustrated in FIG. 1.

Referring to Table 1, in the comparative example, when the pulse duration is 3.0 msec, 1.3 msec, 680 μsec, and 300 μsec, energy density is 40 J/cm$^2$, 20 J/cm$^2$, 9 J/cm$^2$, and 5 J/cm$^2$, respectively. In contrast, in the embodiment, when the pulse duration is 1.5 msec, 0.75 msec, 340 μsec, and 150 μsec, energy density is 40 J/cm$^2$, 20 J/cm$^2$, 9 J/cm$^2$, and 5 J/cm$^2$, respectively.

As such, when the sequential irradiation is performed by using the flash lamps 107 and 108, while one flash lamp irradiates light, the other flash lamp performs a charging process for next irradiation. Accordingly, a quicker charge time may be secured compared to the comparative example at the same energy and thus a manufacturing process time may be reduced.

Figure 6A:
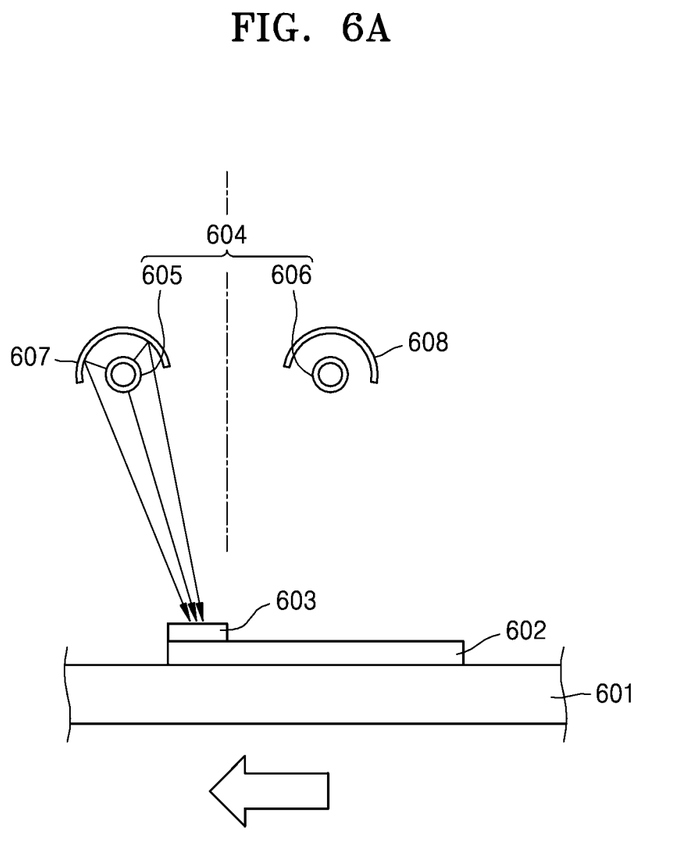
FIG. 6A illustrates a state in which a flash light beam is irradiated from a first flash lamp onto a substrate.
Figure 6B:
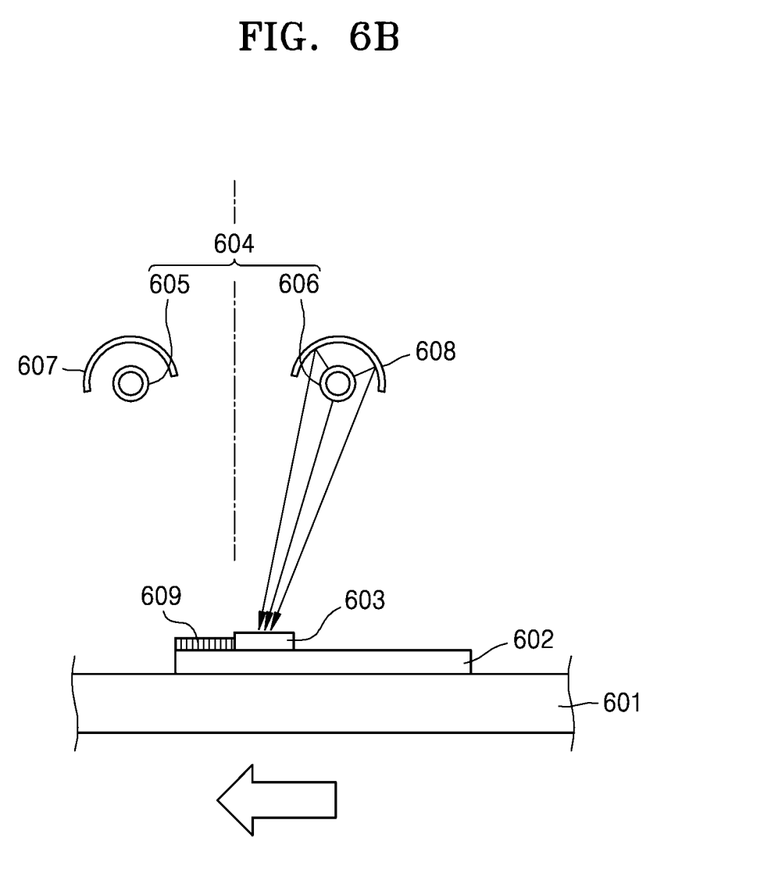
FIG. 6B illustrates a state in which a flash light beam is irradiated from a second flash lamp onto the substrate of FIG. 6A.
Figure 6C:
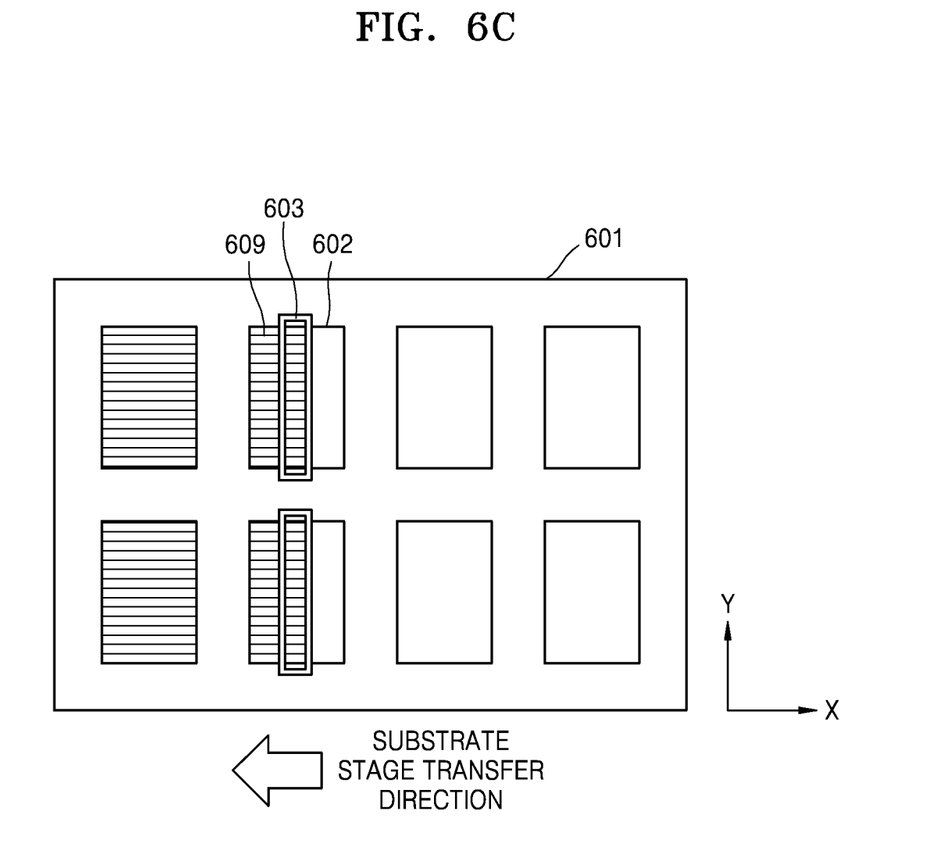
FIG. 6C illustrates a state in which a thin film layer is formed on the substrate of FIG. 6B.

FIGS. 6A to 6C illustrate a thermal treatment method according to another embodiment.

In one embodiment, when an acceptor substrate 602 is a large substrate, a flash light beam is not irradiated across the entire area of a large substrate and is irradiated for each of processing areas.

Referring to FIG. 6A, the acceptor substrate 602 is provided on a substrate stage 601. The substrate stage 601 is movable in one direction. A pattern mask 603 having a transfer layer (not shown) is provided on the acceptor substrate 602. A flash lamp 604 is provided above the substrate stage 601.

The flash lamp 604 includes a first flash lamp 605 and a second flash lamp 606. A first reflector 607 and a second reflector 608 are respectively provided at the rear of the first flash lamp 605 and the second flash lamp 606.

The first flash lamp 605 irradiates a flash light beam toward a first processing area of the acceptor substrate 602.

After the irradiation of a flash light beam toward the first processing area of the acceptor substrate 602 is completed, as illustrated in FIG. 6B, a desired thin film layer 609 is formed in the first processing area. The acceptor substrate 602 is moved a predetermined distance by the substrate stage 601 and the second flash lamp 606 irradiates a flash light beam toward a second processing area that is adjacent to the first processing area of the acceptor substrate 602. While the second flash lamp 606 irradiates a flash light beam onto the acceptor substrate 602, the first flash lamp 605 performs a charging process for irradiation of a third processing area that is adjacent to the second processing area.

As such, as illustrated in FIG. 6C, while the substrate stage 601 moves in one direction, the first flash lamp 605 and the second flash lamp 606 that are symmetrically arranged the processing areas neighboring the acceptor substrate 602 sequentially irradiate flash light beams the respective processing areas. Accordingly, the acceptor substrate 602 is moved while one flash lamp is charged and, since a desired thin film layer is formed, a manufacturing processing time may be reduced.

As described above, in the thermal treatment device and the thermal treatment method according to one or more of the above embodiments, a processing time for patterning a thin film layer on a substrate may be reduced.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present invention as defined by the following claims.

What is claimed is:

1. A thermal treatment method for a display apparatus, the thermal treatment method comprising:
   providing an acceptor substrate on a substrate stage;
   providing on the acceptor substrate a pattern mask including a transfer layer;
   sequentially irradiating a plurality of flash light beams onto the pattern mask from a plurality of flash lamps, wherein, while one of the plurality of flash lamps irradiates a flash light beam, at least one other flash lamp of the plurality of flash lamps performs charging; and
   transferring the transfer layer to the acceptor substrate,
   wherein the plurality of flash lamps are symmetrically provided with respect to the acceptor substrate and are configured to irradiate flash light beams.

2. The thermal treatment method of claim 1, wherein the plurality of flash lamps irradiate flash light beams at a sequential light irradiation time.

3. The thermal treatment method of claim 1, wherein the plurality of flash lamps irradiate flash light beams across an entire area of the acceptor substrate.

4. The thermal treatment method of claim 1, wherein the plurality of flash lamps alternately irradiate flash light beams for each processing area of the acceptor substrate while a substrate moves in one direction.

5. The thermal treatment method of claim 4, wherein the plurality of flash lamps are symmetrically arranged with respect to a neighboring processing area of the acceptor substrate.

6. The thermal treatment method of claim 1, wherein a reflector is provided at a rear of each of the plurality of flash lamps.

7. The thermal treatment method of claim 1, wherein the pattern mask forms on a mask substrate a light pattern portion having a light absorption portion that absorbs a flash light beam and a light reflection portion that reflects the flash light beam, and a transfer layer is formed on the light pattern portion.

8. The thermal treatment method of claim 7, wherein the transfer layer contacts the acceptor substrate.

9. The thermal treatment method of claim 7, wherein a thin film layer is formed on the acceptor substrate as a portion of the transfer layer formed in an area corresponding to the light absorption portion is melted.

10. The thermal treatment method of claim 1, wherein the acceptor substrate comprises:
    at least one thin film transistor formed on the substrate; and
    an organic light-emitting device electrically connected to the thin film transistor and including a first electrode, a second electrode, and an intermediate layer having an organic light-emitting layer formed between the first and second electrodes, and
    wherein the transfer layer comprises a material forming the organic light-emitting layer.

\* \* \* \* \*